(12) United States Patent
Bisanti et al.

(10) Patent No.: US 10,374,549 B2
(45) Date of Patent: Aug. 6, 2019

(54) VARIABLE FREQUENCY OSCILLATOR HAVING WIDE TUNING RANGE AND LOW PHASE NOISE

(71) Applicant: SDRF EURL, Biot (FR)

(72) Inventors: Biagio Bisanti, Antibes (FR); Eric Duvivier, Vallauris Golfe Juan (FR); Lorenzo Carpineto, Antibes (FR); Stefano Cipriani, Antibes (FR); Francesco Coppola, Grasse (FR); Gianni Puccio, La Gaude (FR); Rémi Artinian, Antibes (FR); Francois Marot, Antibes (FR); Vanessa Bedero, Vence (FR); Lysiane Koechlin, Vallauris (FR)

(73) Assignee: SDRF EURL, Sophia Antipolis, Biot (FR)

(*) Notice: Subject to any disclaimer, the term of this patent is extended or adjusted under 35 U.S.C. 154(b) by 161 days.

(21) Appl. No.: 15/399,059

(22) Filed: Jan. 5, 2017

(65) Prior Publication Data

US 2017/0201213 A1 Jul. 13, 2017

(30) Foreign Application Priority Data

Jan. 7, 2016 (EP) .................................... 16290005

(51) Int. Cl.
 *H03B 5/04* (2006.01)
 *H03B 5/12* (2006.01)
 *H03L 7/099* (2006.01)
(52) U.S. Cl.
 CPC .............. *H03B 5/04* (2013.01); *H03B 5/124* (2013.01); *H03B 5/1218* (2013.01);
 (Continued)

(58) Field of Classification Search
 CPC ......... H03L 7/099; H03L 7/08; H03L 7/0812; H03L 1/02; H03L 1/00; H03L 1/026;
 (Continued)

(56) References Cited

U.S. PATENT DOCUMENTS 7,791,422 B2 * 9/2010 Lu ............................ H03B 5/04
 331/167
9,209,744 B1 12/2015 Struble et al.
 (Continued)

OTHER PUBLICATIONS

Sheng-Lyang Jang et al: "A low voltage balanced Clapp VCO in 0.13 micromolar CMOS technology", Microwave and Optical Technology Letiers John Wiley & Sons Inc. USA, vol. 52, No. 7 Jul. 2010 (Jul. 2010), XP002758995.
 (Continued)

*Primary Examiner* — Arnold M Kinkead
(74) *Attorney, Agent, or Firm* — Robert W. Morris; Ojeiku C. Aisiku; Eckert Seamans Cherin & Mellott, LLC

(57) ABSTRACT

Variable frequency oscillators allowing wide tuning range and low phase noise is disclosed. In an illustrative embodiment, a first transistor has a first terminal (e.g. collector) connected to a reference voltage, and a second terminal (e.g. emitter) connected to a first terminal of a first current source and to ground. The first transistor further has a third terminal connected to a first inductor and to a first capacitor connected to the emitter of the first transistor and also to a second capacitor connected to ground. A second transistor is similarly constructed. In order to achieve a variable frequency oscillation between the emitters of the two transistors, a variable tank capacitor is connected between the inductors, forming a circuit connecting in series all passive components composing the LC tank, masking most of parasitic capacitances.

7 Claims, 3 Drawing Sheets

(52) U.S. Cl.
CPC ......... *H03B 5/1231* (2013.01); *H03B 5/1243* (2013.01); *H03L 7/099* (2013.01); *H03B 2200/004* (2013.01); *H03B 2200/0006* (2013.01); *H03B 2200/0008* (2013.01); *H03B 2201/0208* (2013.01)

(58) Field of Classification Search
CPC .... H03L 7/00; H03B 5/04; H03B 5/02; H03B 5/1271; H03B 5/1852; H03B 5/187; H03B 5/32; H03B 5/326; H03B 5/366; H03B 7/08; H03B 2201/0208; H03B 2200/004; H03B 5/124; H03B 5/1231; H03B 5/1218; H03B 5/1243
USPC ..................... 331/167, 177 V, 117 FE, 117 R
See application file for complete search history.

(56) References Cited

U.S. PATENT DOCUMENTS

2011/0018642 A1   1/2011   Li et al.
2014/0347105 A1   11/2014  Rozenblit et al.

OTHER PUBLICATIONS

Sheng-Lyang Jang et al: "A Differential Clapp-VCO in 0.13 $\mu\{\rm m\}$ CMOS Technology", IEEE Microwave and Wireless Components Letters, IEEE Service Center, New York, NY, US, vol. 19, No. 6, Jun. 1, 2009 (Jun. 1, 2009), pp. 404-406, XP011347550.
European Search Report dated Jul. 1, 2016 for Corresponding EP Application No. EP 16290005.4.

* cited by examiner

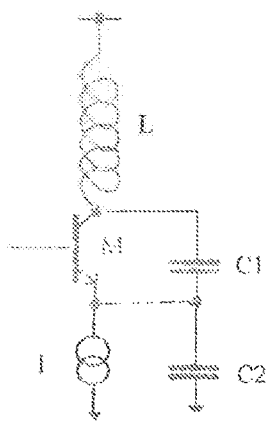
Fig.1A : The Colpitts oscillator
PRIOR ART
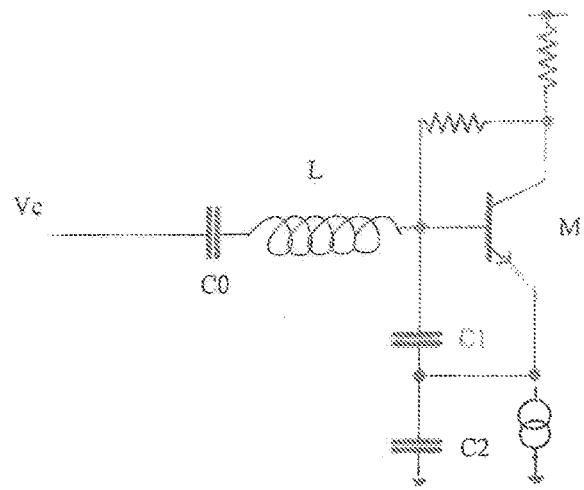
Fig.1B Clapp oscillator
PRIOR ART

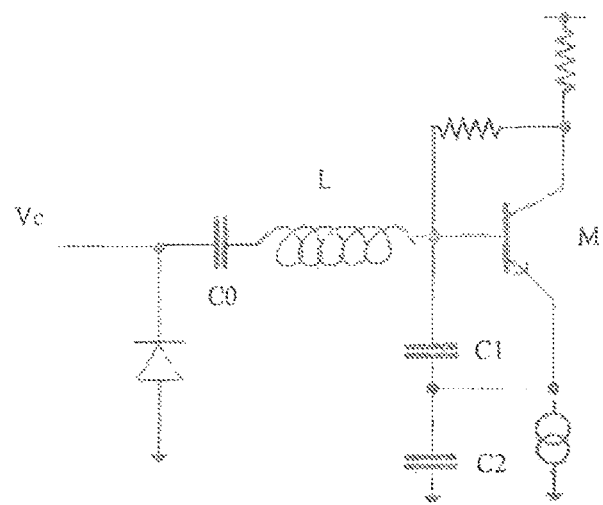
Fig. 2 Clapp oscillator with varactor
PRIOR ART

VARIABLE FREQUENCY OSCILLATOR HAVING WIDE TUNING RANGE AND LOW PHASE NOISE

TECHNICAL FIELD

The invention relates to the field of electronics circuits and more particularly to a wide range voltage control oscillator showing low phase noise.

BACKGROUND ART

Oscillator circuits play quite an important part in the field of electronics circuits, including communication systems, providing clocking and timing signals in digital circuits and frequency translation in radio frequency (RF) circuits.

Among those oscillators, the well-known Colpitts oscillator is widely used in the field. An example of a Colpitts oscillator is illustrated in FIG. 1A showing a transistor M biased by a current source I and associated with an inductance L and the series combination of C1 and C2 capacitors forming the parallel resonant tank circuit defining the oscillation frequency, in accordance with the formula.

$$f = \frac{1}{2\pi\sqrt{L\left(\frac{C_1 C_2}{C_1 + C_2}\right)}}$$

In the Colpitts circuits, the arrangement of a variable frequency oscillator (VFO) requires the voltage divider to include a variable capacitor (either C1 or C2), thus causing the feedback voltage to be variable as well.

A variant of the Colpitts circuit, the well-known Clapp oscillator, avoids this problem by using two fixed capacitors C1 and C2, with a variable Capacitor which is arranged in series with the inductor, as shown in FIG. 2A, and which oscillates at the following frequency:

$$f = \frac{1}{2\pi}\sqrt{\frac{1}{L}\left(\frac{1}{C_0} + \frac{1}{C_1} + \frac{1}{C_2}\right)}$$

The Clapp oscillator is quite often used in association with a varactor, as illustrated in FIG. 2, which is based on a reversely biased diod forming the variable capacitor.

There are other oscillation circuits well-known in the art, and particular those based on a differential topology, such as the well-known cross-coupled differential architecture.

Generally speaking, all those conventional architectures are sensitive to parasitic capacitances which might impair the possibility of achieving, at the same time, a wide tuning range together with a low noise.

Therefore, there is a desire for a new topology of a variable frequency oscillator (F) or a voltage controlled oscillator (VCO) which achieves those goals.

SUMMARY OF THE INVENTION

It is an object of the present invention to provide a variable frequency oscillator (VFO) or a voltage controlled oscillator (VCO) which allows wide tuning range and low phase noise.

It is a further object of the present invention to provide a variable frequency oscillator (VFO), based on the Colpitts or Clapp topology, and which is less sensitive to parasitic capacitances.

It is still another object of the present invention to achieve a variable frequency oscillator (VFO) which can be configured for allowing both digital and analog tuning.

These and other objects of the invention are achieved by means of a variable Frequency oscillator comprising a first transistor and a second transistor, which may be for instance NPN transistors.

The first transistor has a first terminal (e.g. collector) which is connected to a reference voltage, and a second terminal (e.g. emitter) which is connected to a first terminal of a first current source which second terminal is connected to ground. The first transistor further has a third terminal (e.g. base) which is connected to a first terminal of a first inductor and to a top terminal of a first capacitor C1 having a bottom terminal being connected to the emitter of the first transistor and also to a top terminal of a second capacitor C2 having a bottom terminal being connected to ground.

The second transistor has a first terminal (e.g. collector) which is connected to a reference voltage, and a second terminal (e.g. emitter) which is connected to a first terminal of a second current source which second terminal is connected to ground. The second transistor has a third terminal connected to a first terminal of a second inductor and to a top terminal of a third capacitor (C1), wherein the third capacitor has a bottom terminal which is connected to the second terminal (emitter) of the second transistor and also to a top terminal of a fourth capacitor (C2) having a bottom terminal being connected to ground.

In order to achieve a variable frequency oscillation between the emitters (Outn, Outp) of the two transistors 10, 20, a variable tank capacitors is connected between the second terminal of inductors (14, 24), so as to form a circuit connecting in series all passive components composing the LC tank, thus masking most of parasitic capacitances. Consequently, the variable frequency oscillator may be used at a very high frequency.

In one embodiment, the circuit connecting the first and second inductors comprises two varactors connected in series with two capacitors so as to achieve analog control of the oscillation frequency.

Preferably, the varactors are sized so as to compensate temperature variation within the tuning range.

In one embodiment, the circuit connecting the first and second inductors comprises a bank of capacitors arranged in several paths connected in parallel, wherein each path comprises two capacitors connected in series with a switching component, wherein the switching components of all paths are controlled by means of a programmed tank Calibration Word (CW), so as to achieve the tuning of the oscillation frequency.

Preferably, the bank of capacitors comprised within the circuit connecting the inductors is configured so as to allow coarse and fine digital control of the oscillation frequency.

DESCRIPTION OF THE DRAWINGS

Other features of one or more embodiments of the invention will appear from the following description of embodiments of the invention, with reference being made to the accompanying drawings.

FIG. 1a illustrates a first known variable frequency oscillator (VFO) according to the well-known Colpitts topology.

FIG. 1b illustrates a second known variable frequency oscillator (VFO) which complies with the Clapp technology.

FIG. 2 illustrates a variant of a known variable frequency oscillator of FIG. 1b, which further uses a varactor.

DESCRIPTION OF THE PREFERRED EMBODIMENT

Figure 3:
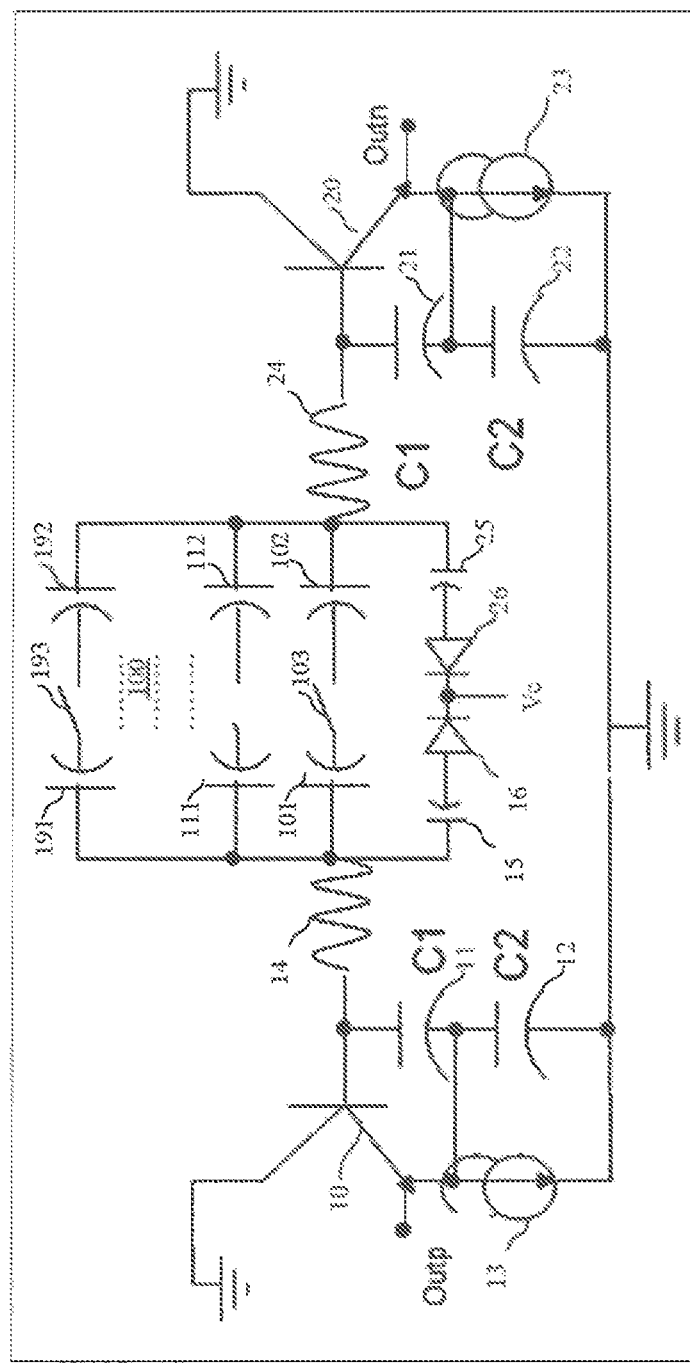
FIG. 3 illustrates one embodiment of a variable frequency oscillator (VFO) of the present invention.

With respect to FIG. 3, there is now described the general architecture of a variable frequency oscillator (VFO) or voltage control oscillator (VCO) which is well adapted for carrying out the RF circuitry of a communication system, with low phase noise and wide tuning range.

For the sake of clarity, FIG. 3 shows the arrangement with simplified biasing so as to focus on the main elements of the preferred embodiments.

The architecture is based on a differential topology comprising a first transistor 10 and a second transistor 20 which, in the embodiment being considered are conventional NPN transistors.

It should be clear that a skilled man will be able to replace transistors 10 and 20 by other transistors, including FET transistors, MOS transistors etc. . . . .

Transistor 10 has an emitter generating a first output signal Outp, a base and a collector. The collector of transistor 10 is connected to a reference voltage, serving as a ground for AC.

a. The emitter of transistor 10 is connected to a first terminal of a first current source 13 having a second terminal connected to ground. The base of transistor 10 is connected to a first terminal of a first inductor 14, and also to the top terminal of a first capacitor 11, having a value of C1. Capacitor 11 has a bottom terminal which is connected to the emitter of transistor 10 but also to a top terminal of a second capacitor 12, having a value C2. Capacitor 12 has a bottom terminal which is connected to ground.

b. Similarly, transistor 20 is based on a Colpitts topology with a feedback network based on a third and a fourth capacitor, respectively of values C1 and C2. More particularly, the emitter of transistor 20 generates a second output signal Outn and is connected to a first terminal of a second current source 23 having a second terminal connected to ground. The base of transistor 20 is connected to a first terminal of a second inductor 24, and also to the top terminal of a third capacitor 21, having a value equal to C1. Capacitor 21 has a bottom terminal which is connected to the emitter of transistor 20 and also to a top terminal of a fourth capacitor 22, having a value C2. Capacitor 22 has a bottom terminal which is connected to ground.

It can be seen that the feedback capacitors 12 and 22 have both their bottom terminal being connected to ground in order to isolate the two transistors 10 and 20. In fact if capacitors 12 and 22 (C2) were connected between the two emitters there would be a 2nd harmonic common mode oscillation building up that dominates over the differential fundamental one and might increase the Phase Noise (PN). This is quite an advantageous effect from the arrangement of FIG. 3, which is highly more effective than the use of a convention 'virtual ground".

In the embodiment which is represented in FIG. 3, first and second inductors 14 and 24 both have a second terminal which are connected via a circuit 100 achieving variable capacitance, so as to form a circuit connecting in series all passive components composing the LC tank: capacitors 11, 12, 22, 21 and the two inductors 14 and 24.

With the consequence that the series connection of all capacitors allows the masking of parasitic capacitances, which was not possible with the conventional topology where the capacitors are viewed in parallel.

In fact—and this observation is true not only for the single ended circuit but also for the differential one, the negative impedance given by the transistor 10 and the capacitor 11 and 12 is (in first approximation)

$$Z_{in} = -i*w*\frac{C_1*C_2}{C_1+C_2} - \frac{gm}{w^2*(C_1+C_2)}$$

$$C_{core} = \frac{C_1*C_2}{C_1+C_2}$$

From the equation reported above one sees that the $C_{core}$ will play un important role in determining the final VCO frequency. If the inductor is connected in parallel with the tuning capacitor we need Ccore to be small compared to the tuning capacitor to increase the tuning range. If on the other end, the inductor is connected in series with the tuning capacitor, as reported in FIG. 3, the bigger $C_{core}$ is the more the tuning range approaches the limit the tuning capacitor can achieve. This clearly shows the advantage of working with higher value capacitor and stay away of the physical Circuit 100 allowing the connection in series of inductors 14 and 24 may take several forms.

In one embodiment, circuit 100 comprises two varactors 16 and 26 connected in series, with their two cathode terminal being connected together, and being further connected in series with two capacitors 15 and 25, so as to achieve a variable capacitance which can be used for performing a tuning of the oscillator. Control of the varactors can be achieved by applying a voltage control at the common cathode terminal of both varactors. In one embodiment, the varactors are sized to compensate with its tuning range the temperature variation and assure that the VCO can lock to the programmed frequency and keep the lock over temperature if locked around a predefined voltage window. The voltage window will move according to the locking temperature.

In one other embodiment, circuit 100 may further comprising a bank of capacitors tank arranged in several paths connected in parallel, respectively 101-102, 111-112, . . . , 191-192, each individual path comprising two capacitors connected in series with a switching component. As seen in FIG. 3, circuit 100 may comprise a first path comprising capacitors 101 and 102 connected in series with a first switching component 103. Furthermore, circuit 100 may comprise a second path comprising capacitors 111 and 112 connected in series with a second switching component 113 . . . . FIG. 3 further illustrates a nth path comprising capacitors 191 and 192 connected series with a nth switching component 193 . . . .

It can be seen that the bank of capacitors comprised within circuit 101 can be controlled by means of programmed tank Calibration Word (CW) which can be used for the purpose of independently controlling the switches 103, 113, . . . 193 . . . . Thanks to such arranged, digital control of the frequency oscillation can be achieved.

In one embodiment, the bank of capacitors forming the tank's capacitor bank of circuit 100 is made by a coarse and fine bank. The capacitors in the coarse and fine bank are of different type therefore an important overlap was considered between the coarse and fine range. The coarse bank is a 5 bit binary weighted capacitive MIM bank (Metal Insulator Metal . . . ) whereas fine bank is a three bits binary weighted Metal Fringe bank (except for the lower frequency VCO where both banks are MIM).

Control of the oscillation frequency can also be performed via an analog control, which can be done by applying a control voltage at the common cathode of varactors 16 and 26.

As mentioned previously, the circuit of FIG. 3 is simplified and does not show all components that might be useful for the biasing of the transistors. However, such components are well known to a skilled man and do not need any further development. It suffices to say that, in one embodiment, the bias current of both transistors is set by a resistor (not shown in FIG. 3) whose value can be programmed: the resistor value changes with the programmed tank Calibration Word (CW) applied for the control of switching elements 113, 123, 193, in order to keep the oscillation amplitude constant across the desired VCO digital tuning range.

APPLICATION OF THE INVENTION

The invention may be used for carrying out a VCO to be implemented in a Radio Frequency (RF) circuit of a communication apparatus. When a wide frequency range is to be considered, one may combine several variable frequency oscillator, as described above, in order to combine a circuit which allows wide frequency range.

Such arrangement achieves at the same time good phase noise and wide tuning range working on the Tank's series resonance.

The invention claimed is:

1. Variable frequency oscillator comprising a first transistor and a second transistor;
wherein said first transistor has a first terminal—collector—which is connected to a reference voltage, and a second terminal—emitter—which is connected to a first terminal of a first current source which second terminal is connected to ground, and a third terminal—base—connected to a first terminal of a first inductor and to a top terminal of a first capacitor, wherein said first capacitor has a bottom terminal which is connected to said second terminal—emitter—of said first transistor but also to a top terminal of a second capacitor having a bottom terminal being connected to ground;
wherein said second transistor has a first terminal—collector—which is connected to a reference voltage, and a second terminal—emitter—which is connected to a first terminal of a second current source which second terminal) is connected to ground, and a third terminal—base—connected to a first terminal of a second inductor and to a top terminal of a third capacitor, wherein said third capacitor has a bottom terminal which is connected to said second terminal—emitter—of said second transistor and also to a top terminal of a fourth capacitor having a bottom terminal being connected to ground;
wherein said first and second inductors have a second terminal which are connected via a circuit achieving variable capacitance, so as to form a circuit connecting in series all passive components composing the LC tank,
so as to achieve a variable capacitance which can be used for performing a tuning of the oscillator; and
wherein said second capacitor and said fourth capacitor are both connected to the physical ground thereby avoiding a 2nd harmonic common mode oscillation that might dominate over the differential fundamental one and might increase the phase noise.

2. Variable frequency oscillator according to claim 1, wherein said circuit connecting said first and second inductor comprises two varactors connected in series with two capacitors, wherein each of said varactors has a cathode terminal which is connected to the cathode terminal of said other varactor and to which is applied a control voltage so as to achieve analog control of the oscillation frequency.

3. Variable frequency oscillator according to claim 2, wherein said varactors are sized so as to compensate temperature variation within the tuning range.

4. Variable frequency oscillator according to claim 1, wherein said circuit connecting said first and second inductor comprises a bank of capacitors arranged in several paths, each path comprising two capacitors connected in series with a switching component, wherein the switching components of all paths are controlled by means of a programmed tank Calibration Word (CW), so as to achieve the tuning of the oscillation frequency.

5. Variable frequency oscillator according to claim 4, wherein said bank of capacitors comprised within said circuit connecting said first and second inductors is configured so as to allow coarse and fine digital control of the oscillation frequency.

6. Variable frequency oscillator according to claim 1, wherein said first and second transistors are NPN transistors which first, second and third terminal are respectively a collector, an emitter and a base.

7. Variable frequency oscillator according to claim 1, wherein said first and third capacitors have a value of C1 and said second and fourth capacitors have a value of C2.

* * * * *